(12) United States Patent
Shroff et al.

(10) Patent No.: US 8,877,601 B2
(45) Date of Patent: Nov. 4, 2014

(54) LATERAL CAPACITOR AND METHOD OF MAKING

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 881 days.

(21) Appl. No.: 12/886,859

(22) Filed: Sep. 21, 2010

(65) Prior Publication Data

US 2012/0068305 A1 Mar. 22, 2012

(51) Int. Cl.
*H01L 21/76* (2006.01)

(52) U.S. Cl.
USPC ........................................... 438/424; 438/400

(58) Field of Classification Search
USPC .................................................. 438/400, 424
See application file for complete search history.

(56) References Cited

U.S. PATENT DOCUMENTS

| | | | |
|---|---|---|---|
| 2005/0086780 A1* | 4/2005 | Shao et al. | 29/25.41 |
| 2007/0037384 A1* | 2/2007 | Su et al. | 438/637 |
| 2007/0294871 A1* | 12/2007 | Felsner et al. | 29/25.03 |
| 2010/0078695 A1* | 4/2010 | Law et al. | 257/296 |
| 2010/0232085 A1* | 9/2010 | Wang | 361/303 |

* cited by examiner

*Primary Examiner* — Jae Lee
(74) *Attorney, Agent, or Firm* — James L. Clingan, Jr.; Joanna G. Chiu

(57) ABSTRACT

An active device region is formed in and on a semiconductor substrate. An interconnect layer is formed over the active device region, wherein the interconnect layer comprises a first dielectric material having a first dielectric constant, a first metal interconnect in the first dielectric material, and a second metal interconnect in the first dielectric material and laterally spaced apart from the first metal interconnect. A portion of the first dielectric material is removed such that a remaining portion of the first dielectric material remains within the interconnect layer, wherein the removed portion is removed from a location between the first and second metal interconnects. The location between the first and second metal interconnects from which the portion of the first dielectric material was removed is filled with a second dielectric material having a second dielectric constant, the second dielectric constant being higher than the first dielectric constant.

14 Claims, 10 Drawing Sheets

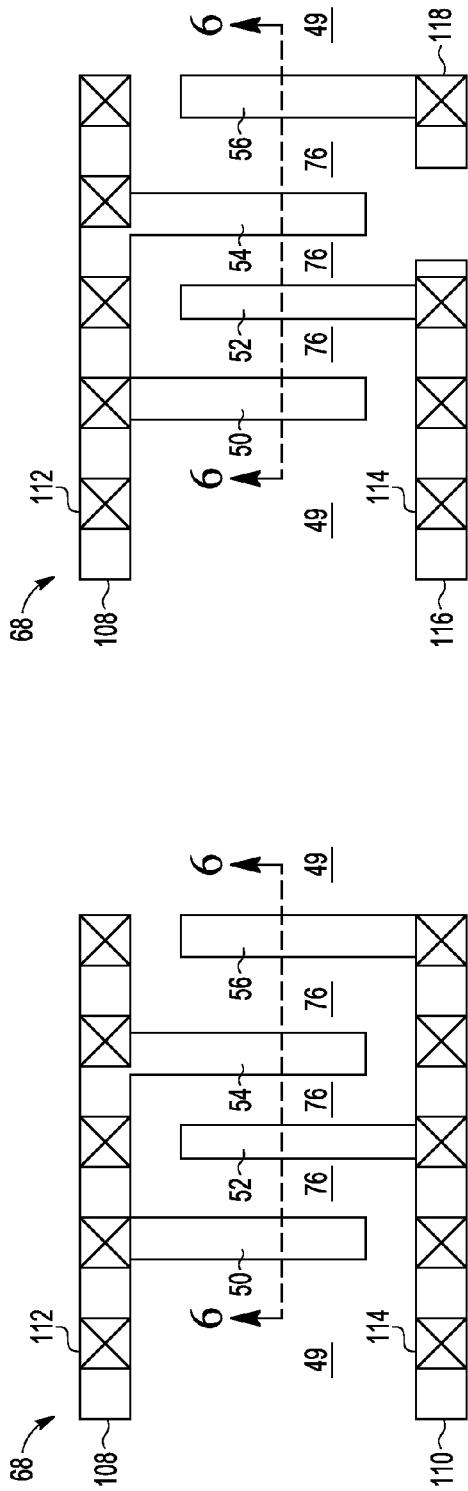
FIG. 11
FIG. 10
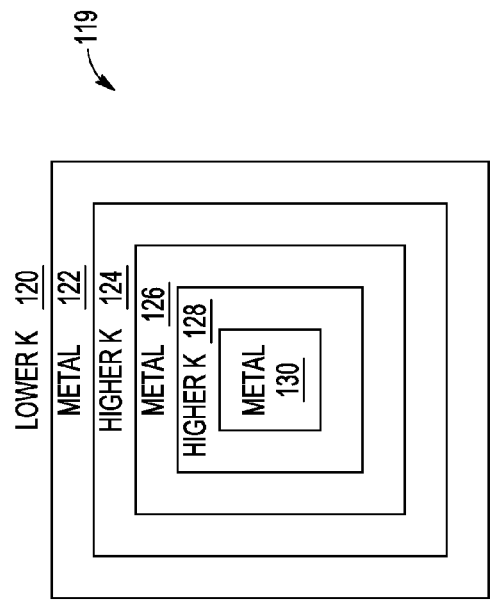
FIG. 12

LATERAL CAPACITOR AND METHOD OF MAKING

BACKGROUND

1. Field

This disclosure relates generally to capacitors made as part of an integrated circuit, and more particularly for the case in which the capacitors are lateral capacitors.

2. Related Art

Capacitors play an important role in a number of circuit applications. The variety of applications place a corresponding variety of requirements on the capacitors. For example, in some applications a very important issue is the accuracy of the capacitance. In other applications, having a large capacitance is particularly important. The constraints are similar in that it is desirable for the capacitors to occupy a small amount of space whether the important issues are precision or magnitude or a different issue. Also, process complexity is important because of cost.

Thus there is a need for capacitors that can improve upon providing the desired capacitance while reducing costs by reducing the area required for the capacitor without undue process complexity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 10 is a top view of a first capacitor that may be built based on the cross section of FIG. 6;

FIG. 11 is a top view of multiple capacitors that may be built based on the device structure of FIG. 6; and FIG. 12 is a top view for an alternative capacitor structure that may be built using the approach described in FIGS. 1-9.

DETAILED DESCRIPTION

In one aspect, a capacitor is built by forming a plurality of conductive structures in a first metal layer in which the first metal layer has portions spaced apart with a first dielectric layer in between. The first dielectric layer has use as an interlayer dielectric layer and has a first dielectric constant. The first dielectric is removed between the spaced apart portions and replaced with a second dielectric having a higher dielectric constant. The first dielectric layer is retained sufficiently to retain its function as an interlayer dielectric.

Figure 1:
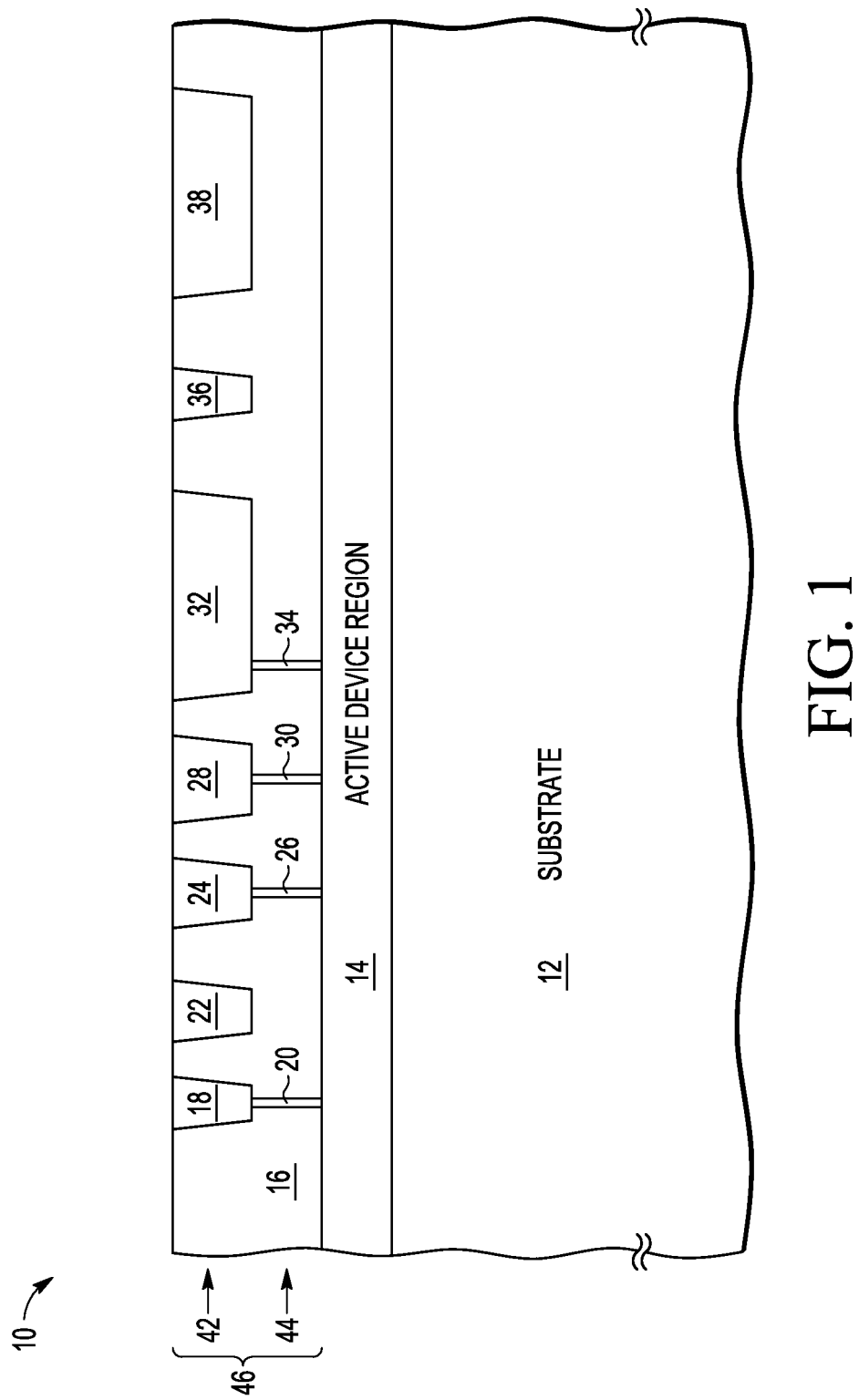
FIG. 1 is a cross section of a device structure for use in making a capacitor as part of an integrated circuit at a stage in processing.

Shown in FIG. 1 is device structure 10 comprising a semiconductor substrate 12, an active device region 14, an interlayer dielectric layer 16, a metal interconnect 18, a metal interconnect 22, a metal interconnect 24, a metal interconnect 28, a metal interconnect 32, a metal interconnect 36, a metal interconnect 38, a via 20 connecting metal interconnect 18 to active device region 14, a via 26 connecting metal interconnect 24 to active device region 14, a via 30 connecting metal interconnect 28 to active region 14, and a via 34 connecting metal interconnect 32 to active device region 14. Metal interconnects 18, 22, 24, 28, 32, 36, and 38 are formed in an upper portion of interlayer dielectric layer 16, and vias 20, 26, 30, and 34 are formed in the lower portion of interlayer dielectric 16. Metal interconnects 18, 22, 24, 28, 32, 36, and 38 together with the upper portion of interlayer dielectric layer 16 form a trench-level portion 42, and vias 20, 26, 30, and 34 together with the lower portion of interlayer dielectric 16 form a via-level portion 44. Via-level portion 44 and trench-level portion 42 together form an interconnect layer 46. Interconnect layer 46 may also include an etch stop region between via-level portion 44 and trench-level portion 42. Active device region 14 includes transistor gates and other structures useful in forming active devices. Active region 14 may also include passive devices such as resistors. The first interconnect layer, which is interconnect layer 46, is generally best used just for interconnect which is what is shown in this example, but the first interconnect layer is not necessarily excluded from use for other purposes. Vias 20, 26, 30, and 34 are representative of the connections which may occur between active region 14 and metal interconnects 18, 22, 24, 28, 32, 36, and 38.

Figure 2:
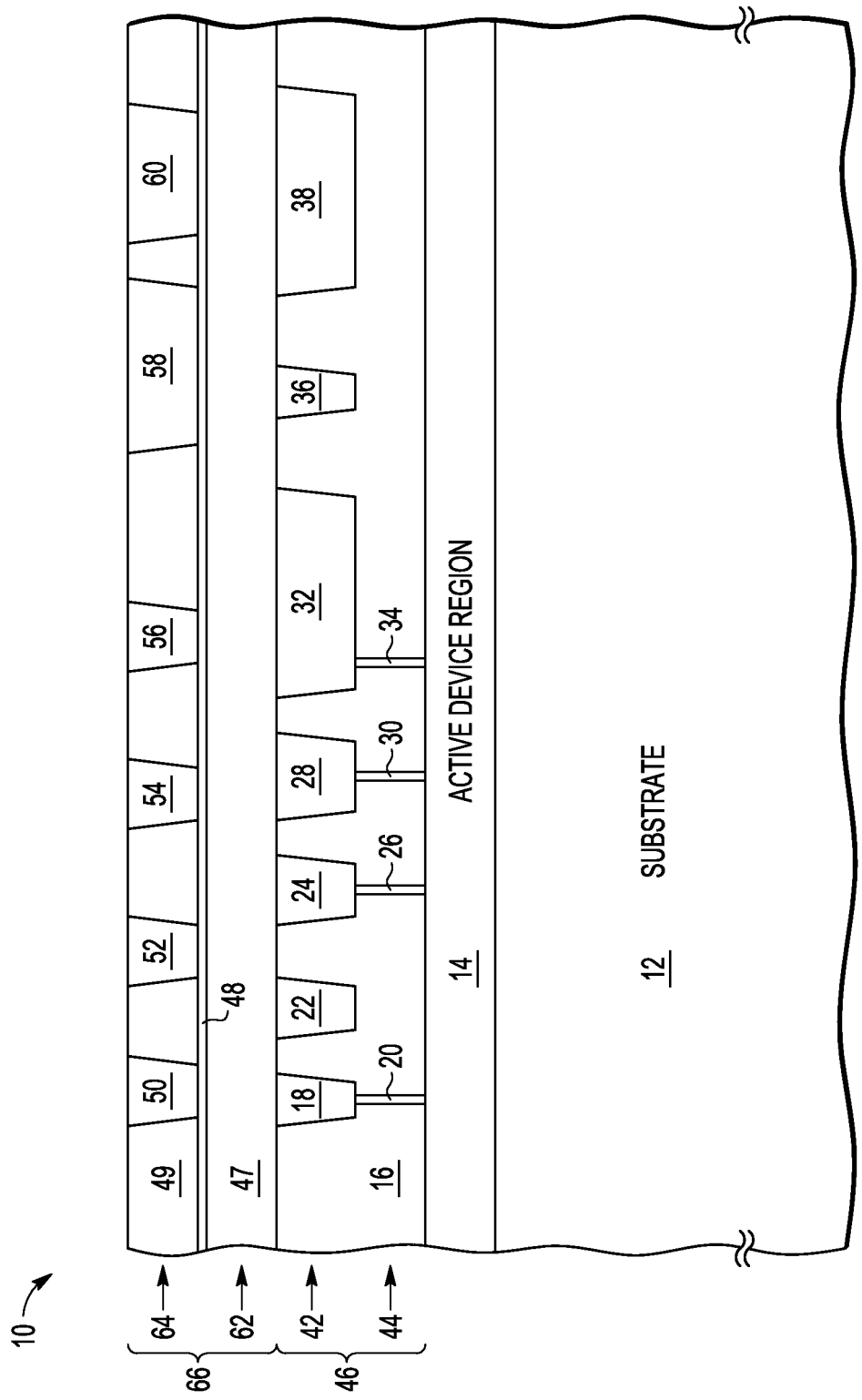
FIG. 2 is a cross section of the device structure of FIG. 1 at a subsequent stage in processing.

Shown in FIG. 2 is device structure 10 after forming an interconnect layer 66 formed from a trench-level portion 64, a via-level portion 62, and an etch stop layer 48 between via-level portion 62 and trench-level portion 64. Etch stop layer 48 is very thin compared to via-level portion 62 and trench-level portion 64. Via-level portion 62 includes a dielectric layer 47 and vias. These vias are not shown in the portion shown in this cross-section. Trench-level portion 64 includes a dielectric layer 49 and metal interconnects 50, 52, 54, 56, 58, and 60. Dielectric layers 47 and 49 may each be an oxide such as tetraethylorthosilicate (TEOS) and etch stop layer 48 may be nitride. Other materials may be used as well. For example, a material known as a low k (dielectric constant) material such as SiCOH (a chemical combination including silicon, carbon, oxygen, and hydrogen) may be used for layers 47 and 49. As shown in FIG. 2, metal interconnects 50, 52, 54, and 56 are evenly spaced from one another but under some circumstances the spacing may beneficially be non-uniform. For nearly all circuit applications, an interlayer dielectric is preferably a relatively lower k dielectric to reduce parasitic capacitance. An etch stop layer, not shown in the drawings, may also be present at the interface between interconnect layers 46 and 66. This etch stop layer is beneficial when performing an etch for forming vias.

Figure 3:
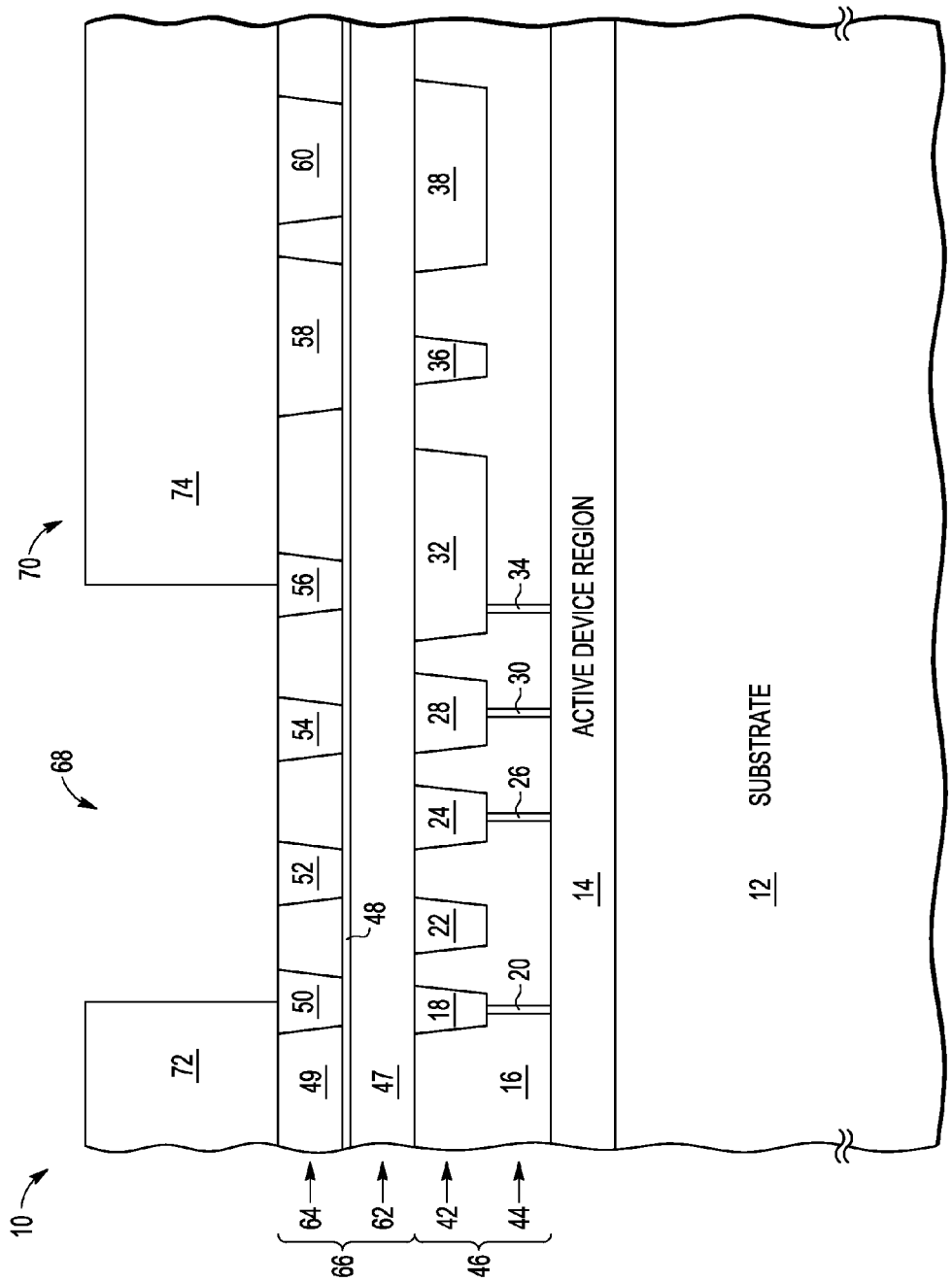
FIG. 3 is a cross section of the device structure of FIG. 2 at a subsequent stage in processing

Shown in FIG. 3 is device structure 10 after forming and patterning a photoresist layer to leave a portion 72 and a portion 74 with an open space over a capacitor region 68. That exposes dielectric layer 49 between metal interconnects 50 and 52, between metal interconnects 52 and 54, and between metal interconnects 54 and 56. The portion shown in FIG. 3 as region 70 and covered by portion 74 is representative of the portion or portions of the whole integrated circuit, of which a portion is shown in FIGS. 1-9, that are not a capacitor region such as capacitor region 68. Region 70 may be called a lower dielectric constant region. It may be noted that while FIG. 3 shows the photoresist edges placed on the outermost electrodes of the capacitor, other embodiments may have the photoresist edge placed either within or beyond the outermost electrodes of the capacitor. Alternatively, the photoresist edges may also be placed on a ring of metal formed outside the outermost electrodes of the capacitor.

Figure 4:
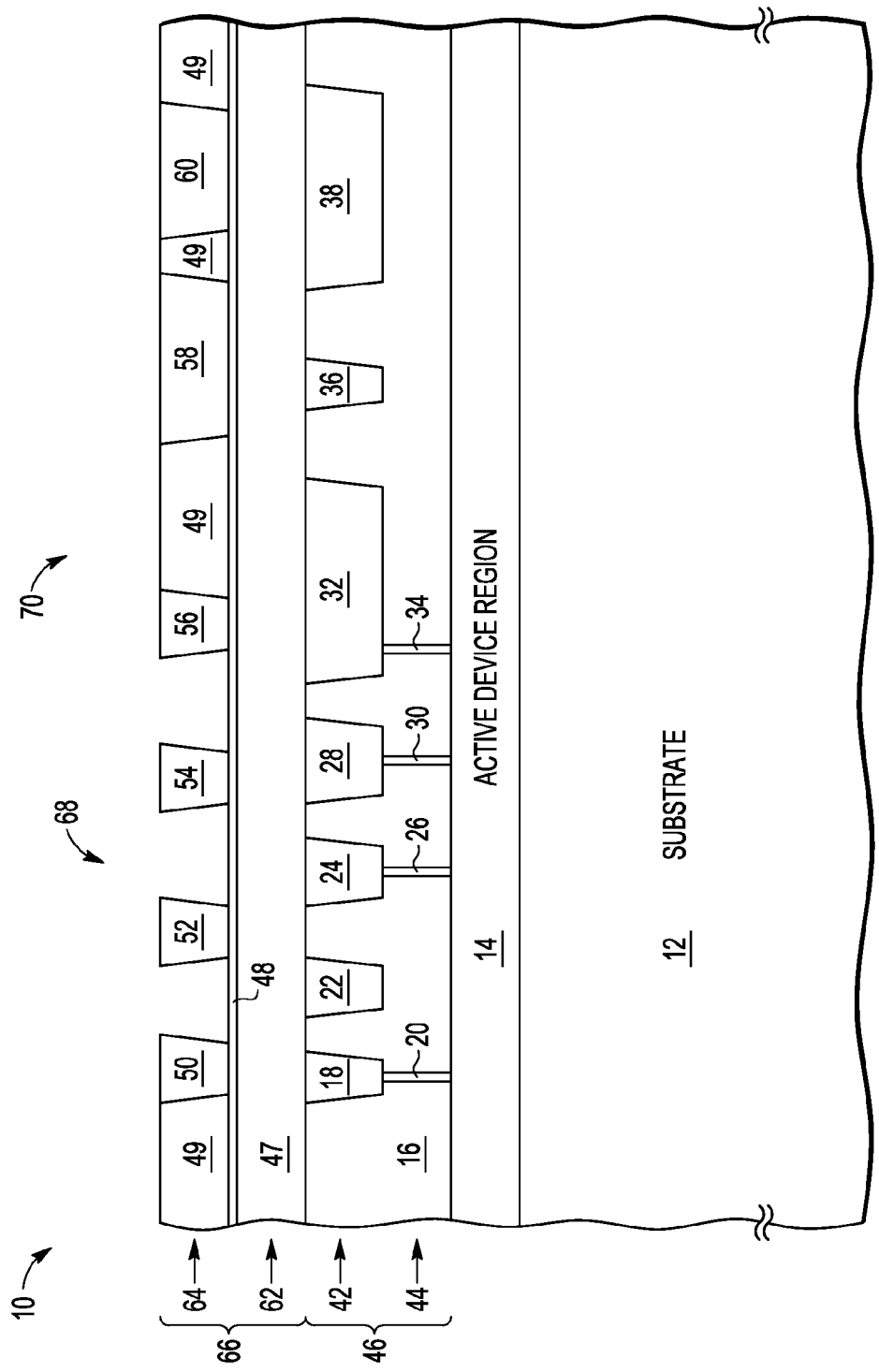
FIG. 4 is a cross section of the device structure of FIG. 3 at a subsequent stage in processing.

Shown in FIG. 4 is device structure 10 after removing dielectric layer 49 between metal interconnects 50 and 52, between metal interconnects 52 and 54, and between metal interconnects 54 and 56 and after removing photoresist portions 72 and 74. An isotropic etch may be required for at least a portion of the etch in order to completely remove dielectric layer 49 from sidewalls of metal interconnects 50, 52, 54, and 56.

Figure 5:
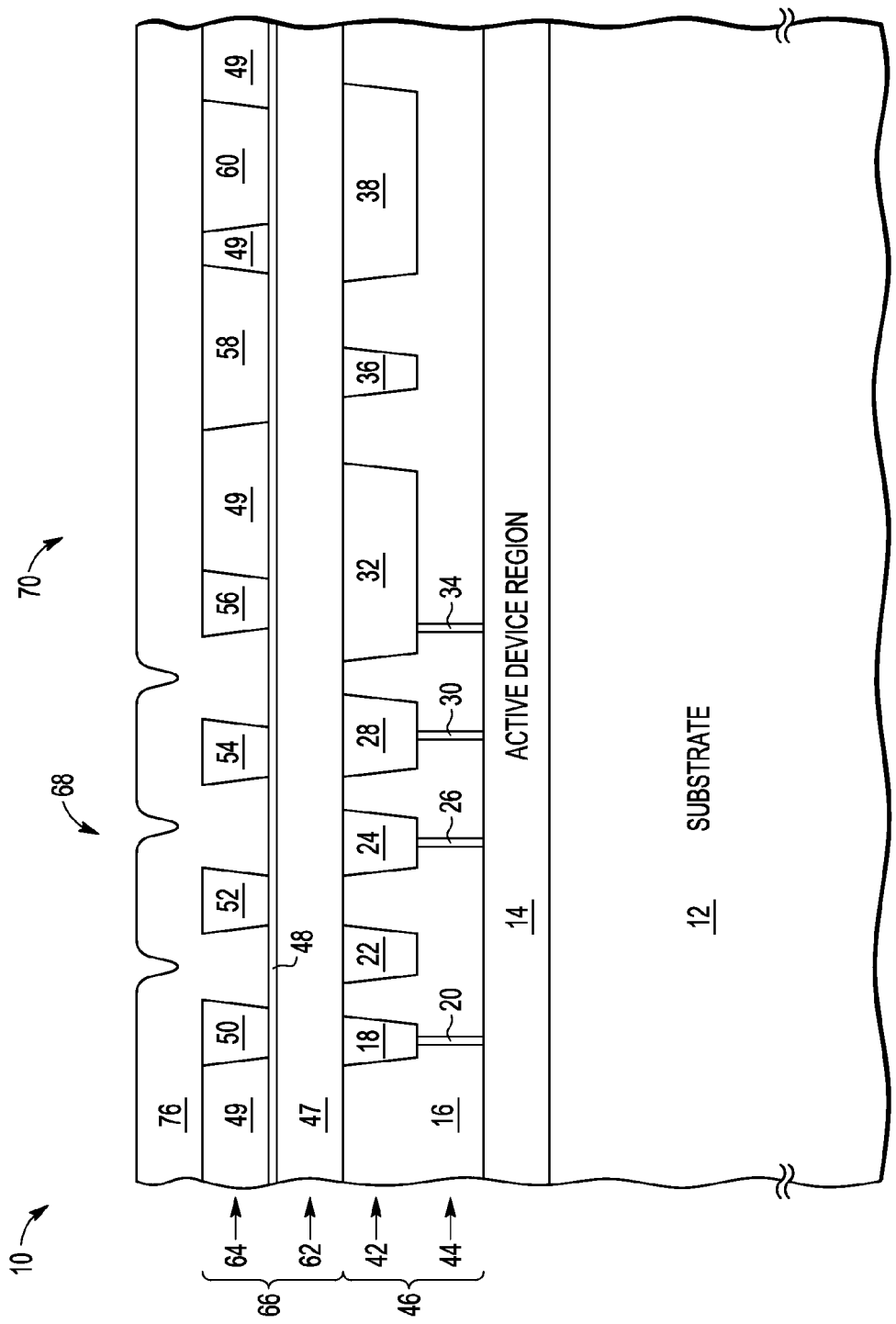
FIG. 5 is a cross section of the device structure of FIG. 4 at a subsequent stage in processing.

Shown in FIG. 5 is device structure 10 after depositing a dielectric layer 76 and thereby filling the regions between metal interconnects 50 and 52, between metal interconnects 52 and 54, and between metal interconnects 54 and 56 with dielectric layer 76. Dielectric layer 76 is chosen to be of a material that has a higher dielectric constant than dielectric layer 49. This may be a material commonly known as a high k dielectric such as hafnium oxide, aluminum oxide, nitride, or some other one to increase the lateral capacitance between metal interconnects 50 and 52, between metal interconnects 52 and 54, and between metal interconnects 54 and 56 as compared to having dielectric layer 49 present in region 68. Nitride has benefits of being relatively easy to work with and being well understood in semiconductor processing, and the high k dielectrics are beneficial as having even higher dielectric constants than nitride. Dielectric layer 76 may be as thick or thicker than the height of metal interconnects 50, 52, 54, 56, 58, and 60 above etch stop layer 48.

Figure 6:
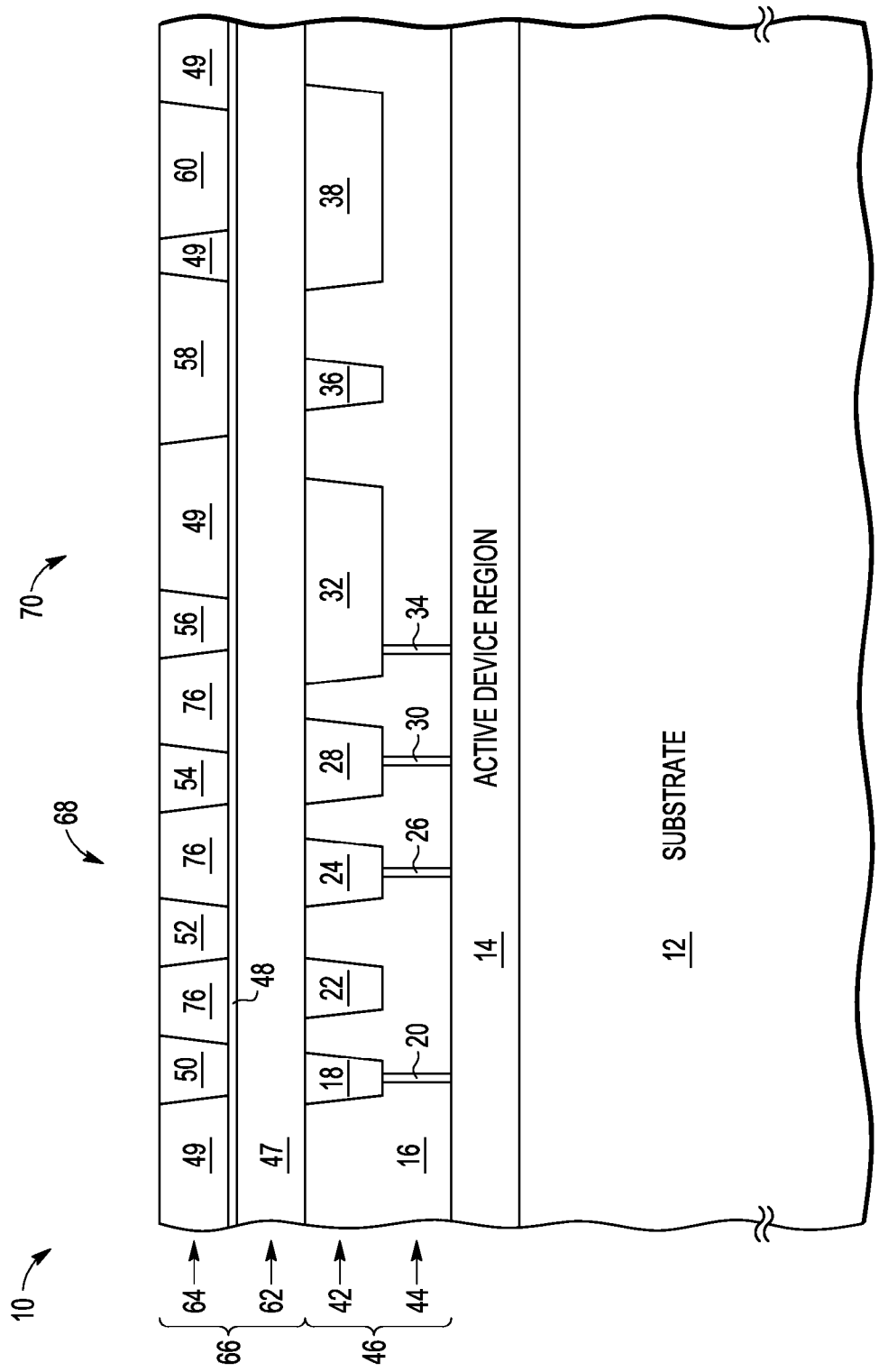
FIG. 6 is a cross section of the device structure of FIG. 5 at a subsequent stage in processing.

Shown in FIG. 6 is device structure 10 after performing chemical mechanical polishing (CMP) on dielectric layer 76 to provide a relatively planar surface even with the height of metal interconnects 50, 52, 54, 56, 58, and 60. This a convenient stopping point for the CMP. Other processing techniques known in the art, such as etchback, may alternatively be employed to achieve this. It may be beneficial to leave a thin layer of dielectric layer 76 over the metal interconnects 50, 52, 54, 56, 58, and 60 to further enhance capacitive coupling. This may be difficult to control though.

Figure 7:
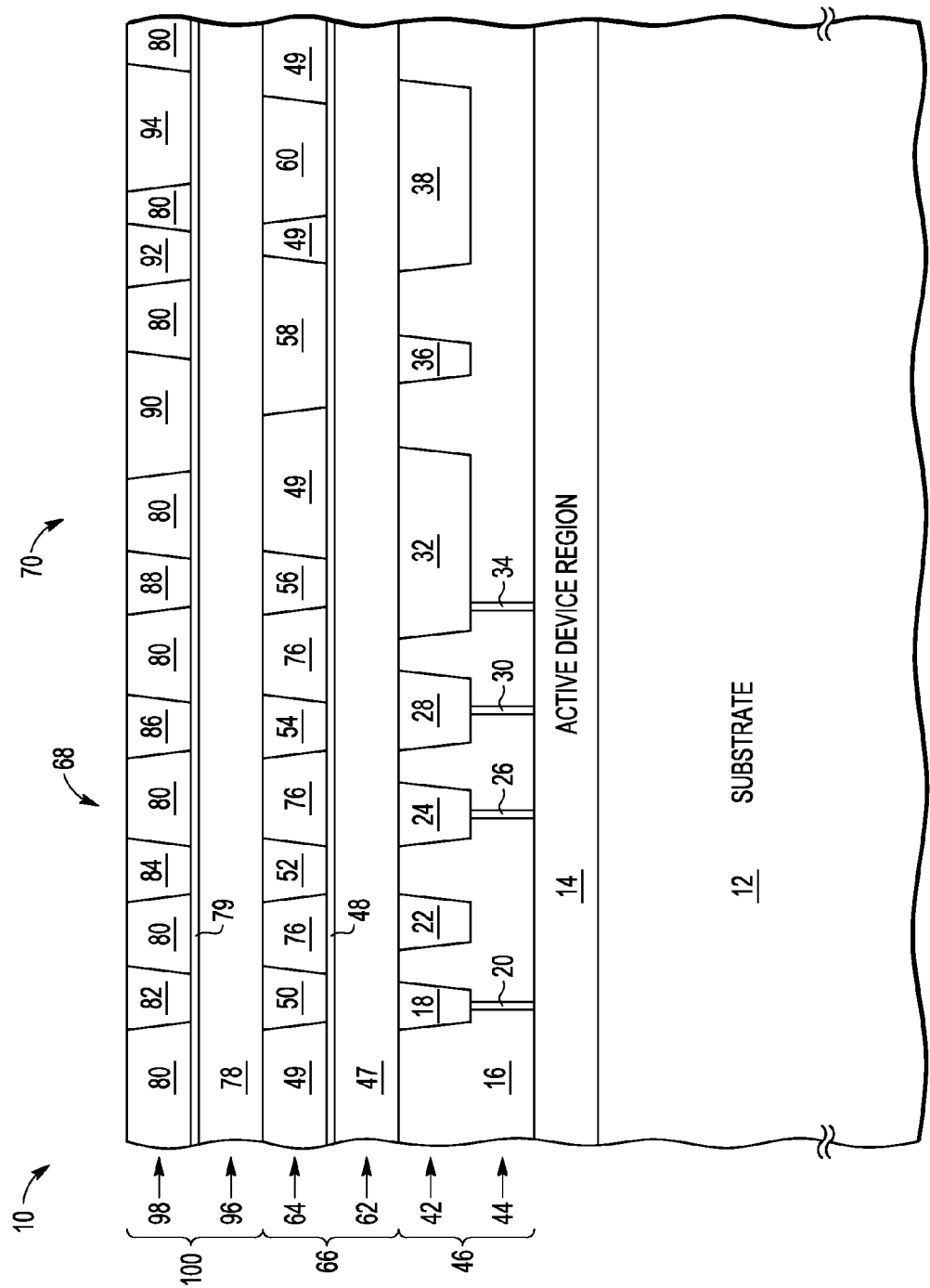
FIG. 7 is a cross section of the device structure of FIG. 6 at a subsequent stage in processing.

Shown in FIG. 7 is device structure 10 after forming interconnect layer 100 on interconnect layer 66. Interconnect layer 100 includes a via-level portion 96, trench-level portion 98, and etch stop layer 79 between via-level portion 96 and trench-level portion 98. Via-level portion 96 includes a dielectric layer 78 and vias that are not shown in the portion shown in this cross-section. Trench-level portion 98 includes a dielectric layer 80 and metal interconnects 82, 84, 86, 88, 90, 92, and 94. Interconnect layer 100 is substantially the same as interconnect layer 66 as shown in FIG. 2 but with a different interconnect pattern and corresponding vias. In capacitor region 68, interconnect layer 100 has metal interconnects 82, 84, 86, and 88 aligned to metal interconnects 50, 52, 54, and 56, respectively. An etch stop layer, not shown in the drawings, may also be present at the interface between interconnect layers 100 and 66. This etch stop layer is beneficial when performing an etch for forming vias.

Figure 8:
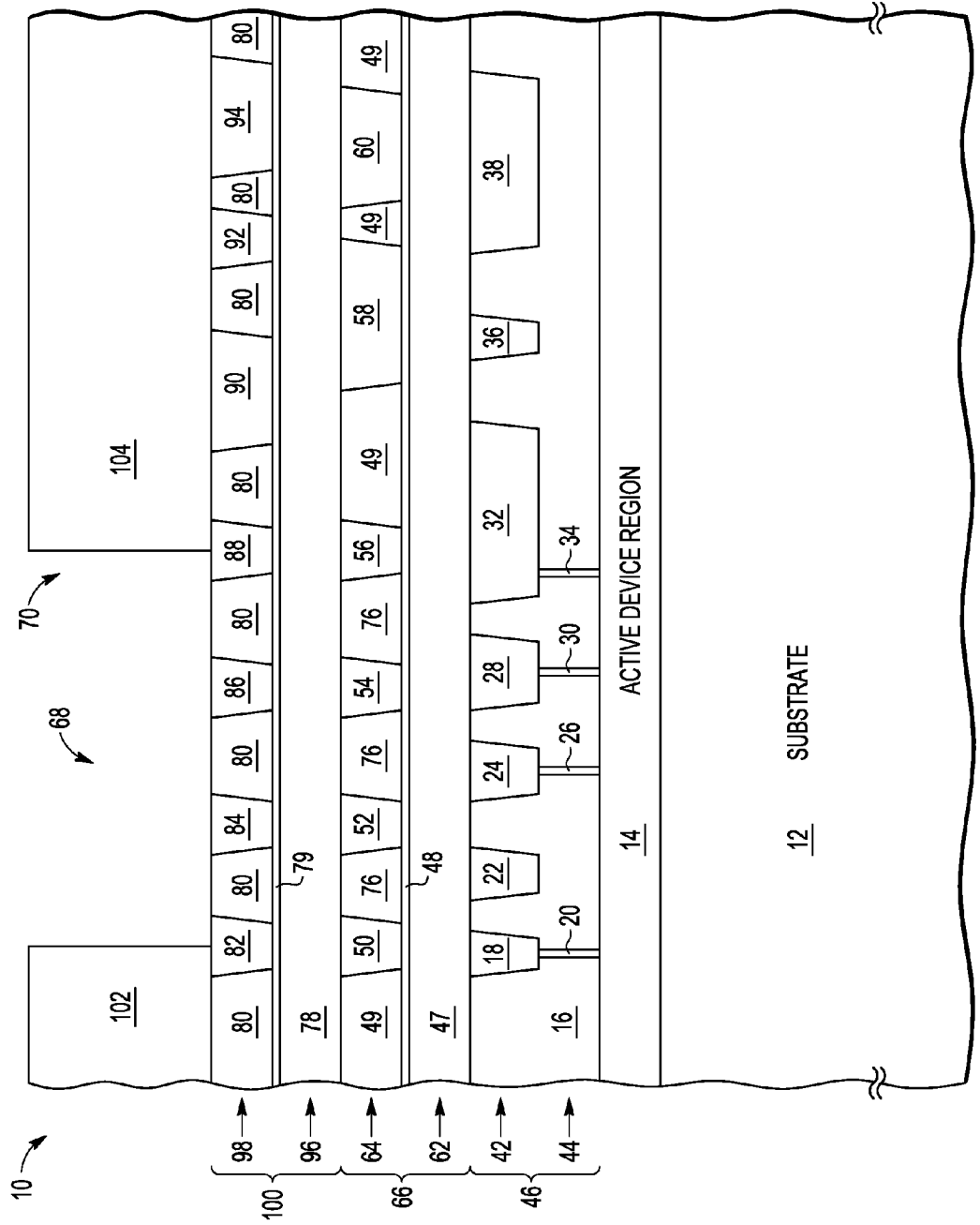
FIG. 8 is a cross section of the device structure of FIG. 7 at a subsequent stage in processing.
Figure 9:
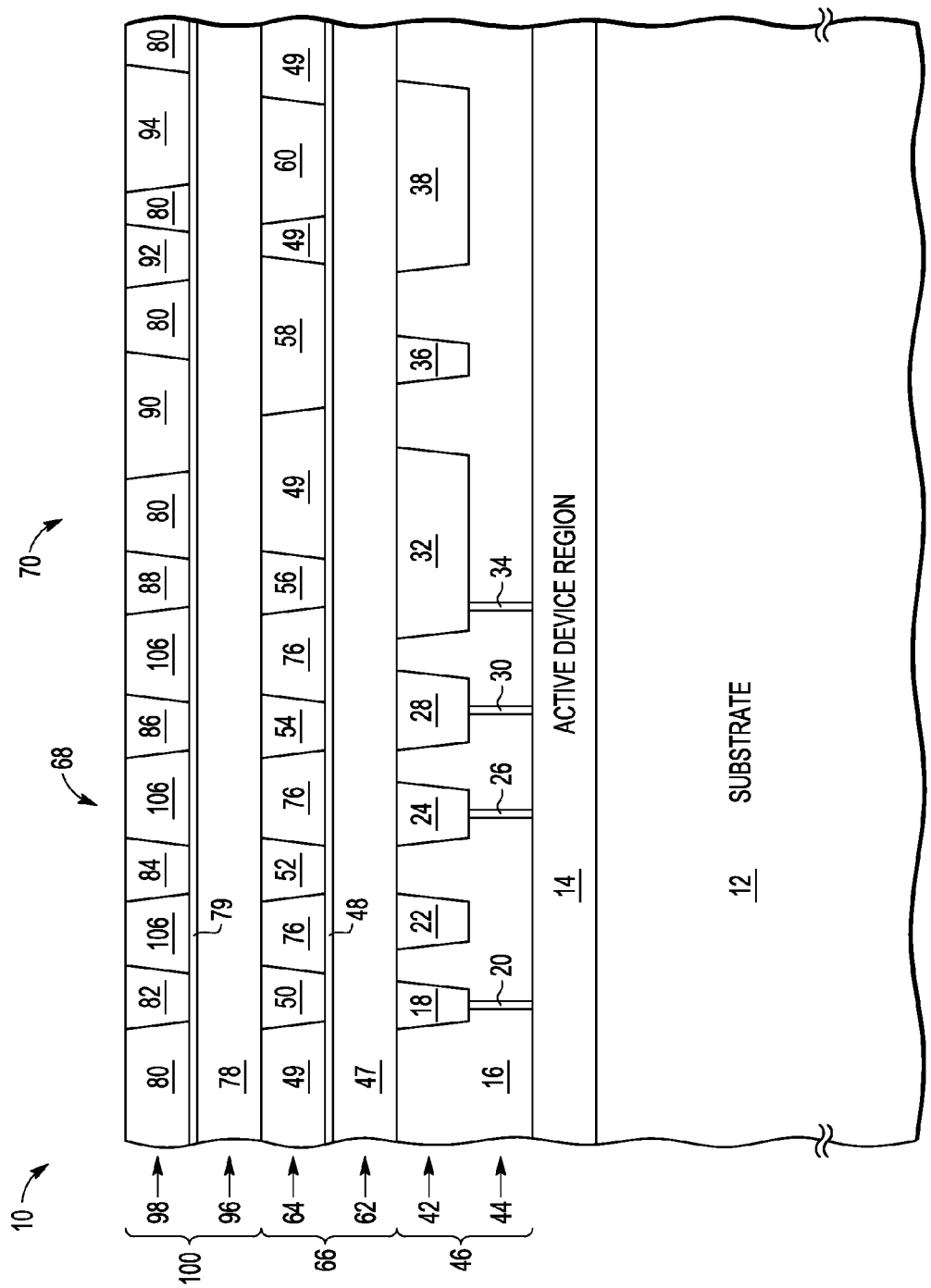
FIG. 9 is a cross section of the device structure of FIG. 8 at a subsequent stage in processing.

Shown in FIG. 8 is device structure 10 after forming and patterning a photoresist layer to leave a portion 102 and a portion 104 with an open space over capacitor region 68. This is substantially the same for interconnect layer 100 as shown in FIG. 3 for interconnect layer 66. Similar processes are continued for interconnect layer 100 as described for interconnect layer 66. It may be noted that while FIG. 8 shows the photoresist edges placed on the outermost electrodes of the capacitor, other embodiments may have the photoresist edge placed either within or beyond the outermost electrodes of the capacitor. Alternatively, the photoresist edges may also be placed on a ring of metal formed outside the outermost electrodes of the capacitor Shown in FIG. 9 is device structure 10 after replacing the lower k dielectric 80 in capacitor region 68 in interconnect layer 100 with a higher k dielectric shown as dielectric 106. The process for achieving the result shown in FIG. 9 for interconnect layer 100 is the same as shown and described for FIGS. 4-7 for interconnect layer 66. The aligned metal interconnects in interconnect layers 100 and 66 may be for different electrodes of a capacitor or even the same electrodes. The vertical capacitance may be too small to be significant and greater precision may be obtained by having aligned electrodes be the same electrode. In either case the lateral capacitance of interconnect layer 100 achieved through metal interconnects 82, 84, 86, and 88 may be added as desired to the lateral capacitance achieved through metal interconnects 50, 52, 54, and 56 of interconnect layer 66. It may be noted that other embodiments may not have the capacitor structures at the various interconnect levels stacked above one another.

Shown in FIG. 10 is a top view of capacitor region 68 of a possible arrangement using the processes to obtain the cross-section of FIG. 6 to achieve a capacitor. This shows an interdigitated arrangement in which a conductive bar 110 has a plurality of contacts, such as contact 114, connected to another interconnect layer. Attached to bar 110 and part of the same interconnect layer 66 are metal interconnects 52 and 56. Also shown is conductive bar 108 having contacts, such as contact 112, connected to another interconnect layer. Attached to bar 108 and part of the same interconnect layer 66 are metal interconnects 50 and 54. Between metal interconnects 50, 52, 54, and 56 is dielectric layer 76 as a capacitor dielectric. The surrounding dielectric is shown as dielectric layer 49 which may be implemented with a low k dielectric. In any event, the dielectric layer 49 is a lower dielectric constant than dielectric layer 76. The higher k dielectric layer 76 may have a sufficiently greater dielectric constant than dielectric layer 49 that metal interconnects 50, 52, 54, and 56 may be spaced greater than minimum spacing and still provide greater capacitance for a given space than the case for using dielectric layer 49 as the capacitor dielectric. The electrodes of the capacitor are conductive bars 108 and 110 along with their respectively connected metal interconnects 50, 54 and 52, 56.

Shown in FIG. 11 is a top view of another possible arrangement using the processes to obtain the cross-section of FIG. 6 to achieve two capacitors having a common electrode. This shows an interdigitated arrangement in which a conductive bar 116, similar to conductive bar 110 of FIG. 10, has a plurality of contacts, such as contact 114, connected to another interconnect layer. Attached to bar 110 and part of the same interconnect layer 66 is metal interconnect 52. Metal interconnect 56 is connected to a different conductive bar 118. Also shown is conductive bar 108 having contacts, such as contact 112, connected to another interconnect layer. Attached to bar 108 and part of the same interconnect layer 66 are metal interconnects 50 and 54. In this case there is one capacitor having electrodes as conductive bars 108 and 116 and another capacitor having electrodes as conductive bars 108 and 118. The capacitance, as shown in FIG. 11, for the capacitor having conductive bars 108 and 118 as electrodes is the lateral capacitance between metal interconnects 54 and 56. The capacitance, as shown in FIG. 11, for the capacitor having conductive bars 108 and 116 as electrodes is the lateral capacitance between metal interconnects 54 and 52 and between metal interconnects 50 and 52. It may be beneficial to have a metal ring around capacitor region 68 as shown in FIG. 10 and FIG. 11 to isolate the higher k material from the lower k material.

Shown in FIG. 12 is top view of a capacitor structure 119 as a further alternative to using a substituted higher k dielectric for an originally formed lower k dielectric in which an inner electrode is a metal 30 surrounded by higher k dielectric layer 128. Higher k dielectric 128 is surrounded by a metal 126. Metal 126 is surrounded by higher k dielectric 124. Higher k dielectric 124 is surrounded by metal 122. Metal 122 is surrounded by lower k dielectric 120. The metal layers are capacitor electrodes and two independent capacitors may be formed by connecting metal 122 and metal 130 to different voltage supplies. One capacitor may be formed by connecting metal 122 and metal 130 together with metal 126 being the common electrode. This is a very efficient layout for a capacitor.

Using a relatively simple mask step, as shown in FIGS. 3 and 8, with an etch of material that is relatively easy to etch, and a fill with a higher k material, results in a relatively high capacitance while not compromising the benefits of a low k interlayer dielectric. The CMP step for removing the higher k material from areas where it is not desirable, does not require a mask step. As an alternative to CMP, an etchback process may be found to be effective.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided a method for forming a semiconductor structure. The method includes forming an active device region in and on a semiconductor substrate. The method further includes forming an interconnect layer over the active device region, wherein the interconnect layer comprises a first dielectric material having a first dielectric constant, a first metal interconnect in the first dielectric material, and a second metal interconnect in the first dielectric material and laterally spaced apart from the first metal interconnect. The method further includes removing a portion of the first dielectric material such that a remaining portion of the first dielectric material remains within the interconnect layer, wherein the removed portion is removed from a location between the first and second metal interconnects. The method further includes filling the location between the first and second metal interconnects from which the portion of the first dielectric material was removed with a second dielectric material having a second dielectric constant, the second dielectric constant being higher than the first dielectric constant. The method may have a further characterization by which the interconnect layer comprises a third metal interconnect in the first dielectric material laterally spaced apart from the first metal interconnect, and wherein the step of removing the portion of the first dielectric material is performed such that the removed portion is also removed from a second location between the second and third metal interconnects. The method may have a further characterization by which the step of filling comprises filling the second location between the second and third metal interconnects with the second dielectric material. The method may have a further characterization by which the step of forming the interconnect layer comprises forming a lateral capacitor in the interconnect layer, wherein the first, second, and third metal interconnects are electrodes of the lateral capacitor. The method may have a further characterization by which the step of forming the interconnect layer comprises forming a first and a second lateral capacitor in the interconnect layer, wherein the first and second metal interconnects are electrodes of the first lateral capacitor and the second and third metal interconnects are electrodes of the second lateral capacitor. The method may have a further characterization by which the step of removing the portion of the first dielectric material is performed from a capacitor region of the interconnect layer and the remaining portion remains in a lower dielectric constant region of the interconnect layer. The method may have a further characterization by which the step of forming the interconnect layer comprises forming a lateral capacitor in the interconnect layer, wherein the first and second metal interconnects are electrodes of the lateral capacitor. The method may have a further characterization by which the step of filling includes depositing a layer of the second dielectric material over the interconnect layer, and removing portions of the layer of the second dielectric material which extend above the interconnect layer. The method may have a further characterization by which the step of removing the portions of the layer of the second dielectric material is performed such that a remaining portion of the layer of the second dielectric material remains over each of the first and second metal interconnects. The method may have a further characterization by which the step of forming the interconnect layer includes forming a via-level portion of the interconnect layer over the active device region, forming an etch stop layer over the via-level portion, and forming a trench-level portion of the interconnect layer over the etch stop layer, wherein the trench-level portion comprises the first dielectric material, and the first and second metal interconnects. The method may have a further characterization by which the step of removing the portion of the first dielectric material is performed using the etch stop layer such that the removed portion is removed from the location between the first and second metal interconnects in the trench-level portion.

Also disclosed is a method for forming a semiconductor structure. The method includes forming an active device region in and on a semiconductor substrate. The method further includes forming a first dielectric layer of a first dielectric material over the active device region, wherein the first dielectric material has a first dielectric constant. The method further includes forming an etch stop layer over the first dielectric layer. The method further includes forming a second dielectric layer of a second dielectric material over the etch stop layer, wherein the second dielectric material has a second dielectric constant. The method further includes forming a plurality of conductive vias in the first dielectric layer and a plurality of metal interconnects in the second dielectric layer, wherein the second dielectric layer and the plurality of metal interconnects are further characterized as a trench-level portion of an interconnect layer, wherein each of the plurality of metal interconnects is laterally spaced apart from each other and wherein the plurality of metal interconnects form at least one lateral capacitor. The method further includes removing a portion of the second dielectric material from the trench-level portion of the interconnect layer using the etch stop layer such that the removed portion is removed from locations above the etch-stop layer and between laterally adjacent metal interconnects of the plurality of metal interconnects and a remaining portion of the second dielectric material remains within the trench-level portion of the interconnect layer. The method further includes filling the locations between the laterally adjacent metal interconnects from which the portion of the second dielectric material was removed with a third dielectric material having a third dielectric constant, the third dielectric constant being higher than the second dielectric constant. The method may have a further characterization by which the step of filling includes depositing a third dielectric layer comprising the third dielectric material over the trench-level portion of the interconnect layer, and removing portions of the third dielectric layer which extend above the trench-level portion of the interconnect layer. The method may have a further characterization by which the step of removing the portions of the third dielectric layer is performed such that a remaining portion of the third dielectric layer remains over each of the plurality of metal interconnects. The method may have a further characterization by which the plurality of metal interconnects form interdigitated electrodes of a first lateral capacitor. The method may have a further characterization by which the plurality of metal interconnects form electrodes of multiple lateral capacitors.

Disclosed also is a semiconductor structure including a semiconductor substrate. The semiconductor structure further includes an active device region in and on the semiconductor substrate. The semiconductor structure further includes an interconnect layer over the active device region, wherein the interconnect layer comprises a trench-level portion over a via-level portion, wherein the trench-level portion of the interconnect layer comprises a plurality of metal interconnects, each laterally spaced apart from each other. The trench-level portion includes a first dielectric material between laterally adjacent metal interconnects of the plurality of metal interconnects, the first dielectric material having a first dielectric constant, and a second dielectric material outside the plurality of metal interconnects, the second dielectric material having a second dielectric constant lower than the first dielectric constant. The semiconductor structure may have a further characterization by which the plurality of metal interconnects and the first dielectric material are located in a capacitor region of the semiconductor structure and the second dielectric material is located in a low dielectric constant region of the semiconductor structure, which is laterally adjacent the capacitor region, and wherein the plurality of metal interconnects form at least one lateral capacitor within a trench-level portion of an interconnect level. The semiconductor structure may have a further characterization by which the via-level portion of the interconnect layer comprises the second dielectric material in the capacitor region and comprises the first dielectric material in the low dielectric constant region. The semiconductor structure may further include a second interconnect layer over the interconnect layer, wherein the second interconnect layer comprises a second trench-level portion over a second via-level portion, wherein the second trench-level portion comprises a second plurality of metal interconnects, each laterally spaced apart from each other. The second trench-level portion further includes a third dielectric material between laterally adjacent metal interconnects of the second plurality of metal interconnects, the third dielectric material having a third dielectric constant, and a fourth dielectric material outside the second plurality of metal interconnects, the fourth dielectric material having a fourth dielectric constant lower than the third dielectric constant.

Although the invention is described herein with reference to specific embodiments, various modifications and changes can be made without departing from the scope of the present invention as set forth in the claims below. For example, other layouts for capacitor arrangements may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, comprising:
    forming an active device region in and on a semiconductor substrate;
    forming an interconnect layer over the active device region, wherein the interconnect layer comprises a first dielectric material having a first dielectric constant, a first metal interconnect in the first dielectric material, and a second metal interconnect in the first dielectric material and laterally spaced apart from the first metal interconnect;
    removing a portion of the first dielectric material such that a remaining portion of the first dielectric material remains within the interconnect layer, wherein the removed portion is removed from a location between the first and second metal interconnects; and
    filling the location between the first and second metal interconnects from which the portion of the first dielectric material was removed with a second dielectric material having a second dielectric constant, the second dielectric constant being higher than the first dielectric constant, wherein the step of filling comprises:
        depositing a layer of the second dielectric material over the interconnect layer; and
        removing portions of the layer of the second dielectric material which extend above the interconnect layer such that a remaining portion of the layer of the second dielectric material remains over each of the first and second metal interconnects; and
    forming a second interconnect layer over the remaining portion of the layer of the second dielectric material, wherein the remaining portion of the layer of the second dielectric material is between the second interconnect layer and each of the first and second metal interconnects.

2. The method of claim 1, wherein the interconnect layer comprises a third metal interconnect in the first dielectric material laterally spaced apart from the first metal interconnect, and wherein the step of removing the portion of the first dielectric material is performed such that the removed portion is also removed from a second location between the second and third metal interconnects.

3. The method of claim 2, wherein the step of filling comprises filling the second location between the second and third metal interconnects with the second dielectric material.

4. The method of claim 3, wherein the step of forming the interconnect layer comprises forming a lateral capacitor in the interconnect layer, wherein the first, second, and third metal interconnects are electrodes of the lateral capacitor.

5. The method of claim 4, wherein the step of forming the interconnect layer comprises forming a first and a second lateral capacitor in the interconnect layer, wherein the first and second metal interconnects are electrodes of the first lateral capacitor and the second and third metal interconnects are electrodes of the second lateral capacitor.

6. The method of claim 1, wherein the step of removing the portion of the first dielectric material is performed from a capacitor region of the interconnect layer and the remaining portion remains in a lower dielectric constant region of the interconnect layer.

7. The method of claim 1, wherein the step of forming the interconnect layer comprises forming a lateral capacitor in the interconnect layer, wherein the first and second metal interconnects are electrodes of the lateral capacitor.

8. The method of claim 1, wherein the step of forming the interconnect layer is further characterized in that the interconnect layer further comprises a continuous ring of metal which surrounds the first and second metal interconnects.

9. The method of claim 8, wherein after the step of filling the location between the first and second metal interconnects, the continuous ring of metal is located between the first dielectric material and the second dielectric material.

10. The method of claim 1, wherein the step of forming the interconnect layer comprises:
    forming a via-level portion of the interconnect layer over the active device region;
    forming an etch stop layer over the via-level portion; and
    forming a trench-level portion of the interconnect layer over the etch stop layer, wherein the trench-level portion comprises the first dielectric material, and the first and second metal interconnects.

11. The method of claim 10, wherein the step of removing the portion of the first dielectric material is performed using the etch stop layer such that the removed portion is removed from the location between the first and second metal interconnects in the trench-level portion.

12. A method for forming a semiconductor structure, comprising:
    forming an active device region in and on a semiconductor substrate;
    forming a first dielectric layer of a first dielectric material over the active device region, wherein the first dielectric material has a first dielectric constant;
    forming an etch stop layer over the first dielectric layer;
    forming a second dielectric layer of a second dielectric material over the etch stop layer, wherein the second dielectric material has a second dielectric constant;
    forming a plurality of conductive vias in the first dielectric layer and a plurality of metal interconnects in the second dielectric layer, wherein the second dielectric layer and the plurality of metal interconnects are further characterized as a trench-level portion of an interconnect layer, wherein each of the plurality of metal interconnects is laterally spaced apart from each other and wherein the plurality of metal interconnects form at least one lateral capacitor;
    removing a portion of the second dielectric material from the trench-level portion of the interconnect layer using the etch stop layer such that the removed portion is removed from locations above the etch-stop layer and between laterally adjacent metal interconnects of the plurality of metal interconnects and a remaining portion of the second dielectric material remains within the trench-level portion of the interconnect layer; and
    filling the locations between the laterally adjacent metal interconnects from which the portion of the second dielectric material was removed with a third dielectric material having a third dielectric constant, the third dielectric constant being higher than the second dielectric constant.

13. The method of claim 12, wherein the plurality of metal interconnects form inter-digitated electrodes of a first lateral capacitor.

14. The method of claim 12, wherein the plurality of metal interconnects form electrodes of multiple lateral capacitors.

* * * * *

UNITED STATES PATENT AND TRADEMARK OFFICE
CERTIFICATE OF CORRECTION

PATENT NO. : 8,877,601 B2
APPLICATION NO. : 12/886859
DATED : November 4, 2014
INVENTOR(S) : Mehul D. Shroff and Mark D. Hall It is certified that error appears in the above-identified patent and that said Letters Patent is hereby corrected as shown below:

In the Claims

At column 10, line 28, Claim 12, please change "filling the locations" to be --depositing a layer of a third dielectric material having a third dielectric constant that is higher than the second dielectric constant over the interconnect layer; and removing portions of the layer of the third dielectric material which extend above the interconnect layer such that a remaining portion of the layer of the third dielectric material remains over each of the laterally adjacent metal interconnects; and the locations--

At column 10, line 30, Claim 12, please change "removed with a third dielectric material having a third dielectric constant, the third dielectric constant being higher than the second dielectric constant." to be --removed are filled with the third dielectric material.--

Signed and Sealed this
First Day of September, 2015

Michelle K. Lee
*Director of the United States Patent and Trademark Office*